United States Patent [19]

Shimizu et al.

[11] 4,101,878
[45] Jul. 18, 1978

[54] SELF-CUT-OFF POWER SWITCH FOR A REMOTE CONTROLLED ELECTRONIC EQUIPMENT

[75] Inventors: Keizo Shimizu; Takeshi Maruyama, both of Yokohama; Toshio Fujimura, Fujisawa, all of Japan

[73] Assignee: Hitachi, Ltd., Japan

[21] Appl. No.: 729,263

[22] Filed: Oct. 4, 1976

[30] Foreign Application Priority Data

Oct. 6, 1975 [JP] Japan .................................. 50-119731

[51] Int. Cl.² ............................................ H04M 11/04
[52] U.S. Cl. ............................ 340/310 R; 340/310 A; 343/225
[58] Field of Search ............ 340/310 A, 310 R, 147 R; 343/225

[56] References Cited

U.S. PATENT DOCUMENTS

| | | | |
|---|---|---|---|
| 2,305,862 | 12/1942 | Gilliver | 340/310 A |
| 2,942,249 | 6/1960 | Paull | 340/312 |
| 3,840,871 | 10/1974 | Eguchi | 340/310 R |
| 3,971,028 | 7/1976 | Funk | 340/310 A |

*Primary Examiner*—Harold I. Pitts
*Attorney, Agent, or Firm*—Craig & Antonelli

[57] ABSTRACT

A make-type contact of a relay-type member and a manual switch are connected between a commerical A.C. power supply and a load circuit. The manual switch is turned on only when it is being manually actuated and turned off when it is not manually actuated. A winding of the relay is connected to the load circuit such that an excitation current flows therethroiugh through the load circuit or a control unit, and it is also connected to the control unit for receiving signals from a remote control unit. When the manual switch is turned on through manual actuation, a power is supplied to the load circuit or the control unit to excite the winding-type portion so that the make-type contact is closed to hold the power to the load circuit even after the turn-off of the manual switch. When the control unit, on the other hand receives the signal from the remote control unit the winding-type portion is deenergized to stop the supply of the power to the load circuit.

7 Claims, 3 Drawing Figures

SELF-CUT-OFF POWER SWITCH FOR A REMOTE CONTROLLED ELECTRONIC EQUIPMENT

BACKGROUND OF THE INVENTION

The present invention relates to a power switch circuit for a remote controlled electronic equipment such as a television receiver.

Referring to FIG. 1, a circuit diagram of a prior art power switch circuit for a remote controlled electronic equipment is shown.

In FIG. 1, a power from a commercial A.C. power supply 1 is fed to a control unit 7 for controlling turn-on and turn-off of a relay 3 which is used as an automatic switch, through a manual switch 2, and also fed to a load circuit 5 of the electronic equipment through a make contact 3' of the relay 3. The control unit 7 is put in an operating condition upon turn-on of the manual switch 2. A remote control unit 6 generates an ultrasonic signal which is received by the control unit 7 to control turn-on and turn-off of the relay 3.

In response to the ultrasonic signal (turn-on control signal) from the remote control unit 6, the control unit 7 causes an excitation current to flow through a winding 4 of the relay 3 to turn on or close the make contact 3' so that the excitation current continues to flow through the winding 4 even after the termination of the reception of the ultrasonic signal. When the control unit 7 receives another ultrasonic signal (turn-off control signal or stop signal), it causes the excitation current to be terminated to turn off the make contact 3' so that the relay 3 is kept in its off state even after the termination of the ultrasonic signal. Thus, the control unit 7 serves to alternately switch the relay 3 between its on-state and its off-state.

Since such control unit 7 is required to hold the on or off state of the relay 3 to which it was switched by the ultrasonic signal, the control unit 7 has included a hold means such as a bistable flip-flop.

Furthermore, the control unit 7 includes a complex erroneous operation prevention circuit in order to prevent erroneous operation from occurring due to a spurious ultrasonic signal which may be an ultrasonic signal generated by the strike of keys or coins or an ultrasonic signal generated from telephone ringing. In order to prevent the relay 3 from being turned on by such spurious ultrasonic signal or a malfunction of the control unit 7 once the relay 3 has been turned off by an ultrasonic signal, a manual operation has been required to turn off the manual switch 2.

It is an object of the present invention to provide a power switch circuit for a remote controlled electronic equipment which has overcome the drawbacks of the prior art and which assures the holding of power switch circuit in its off-state by a remote control operation.

It is another object of the present invention to provide a power switch circuit for a remote controlled electronic equipment in which a control unit for controlling the turn-on and turn-off of an automatic switch is turned on by a manual operation and turned off by a remote control turn-off signal.

SUMMARY OF THE INVENTION

To achieve the above objects, in accordance with the present invention, a power of a power supply is fed through an automatic switch to a load circuit and a control unit which controls the turn-on and turn-off of the automatic switch, and a manual means is provided to short-circuit the automatic switch by a manual operation. Once the automatic switch is short-circuited by the manual operation, the control unit holds the automatic switch in its on state until it receives a stop signal from a remote control unit, at which time the control unit turns off the automatic switch. In this manner, once the automatic switch is turned off, it is not turned on unless it is again short-circuited by the manual means.

BRIEF DESCRIPTION OF THE DRAWINGS

The above and other objects, features and advantages of the present invention will become more apparent from the following detailed description of the preferred embodiments when taken in conjunction with the accompanying drawings.

DESCRIPTION OF THE PREFERRED EMBODIMENT

Figure 1:
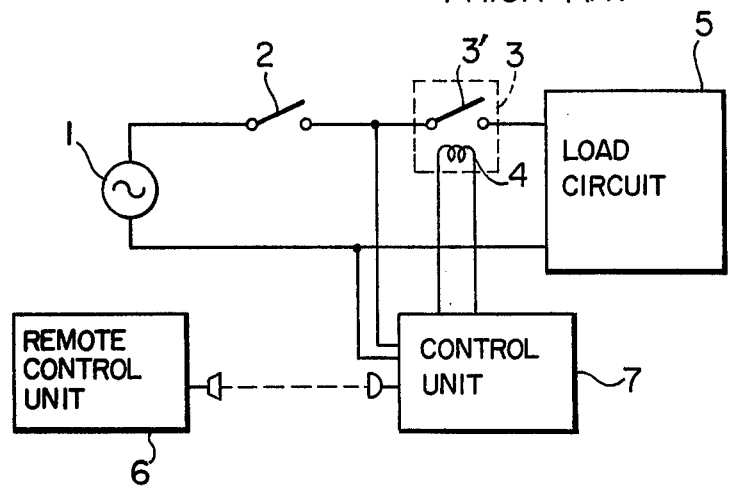
FIG. 1 is a circuit diagram showing a prior art power switch circuit for a remote controlled electronic equipment.
Figure 2:
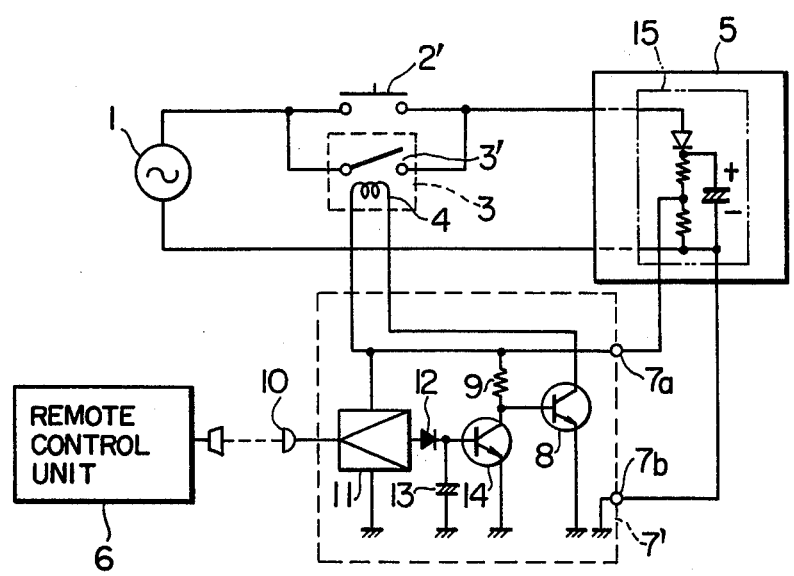
FIG. 2 is a circuit diagram showing one embodiment of a power switch circuit for the remote controlled electronic equipment according to the present invention.

Referring now to FIG. 2, one embodiment of the present invention is shown, in which a manual switch 2' is turned on only during manual actuation thereof and turned off when it is not manually actuated. The manual switch 2' and the make contact 3' of the relay 3 are connected in parallel between the commercial A.C. power supply 1 and the load circuit 5. When at least one of the manual switch 2' and the make contact 3' is turned on, an A.C. power from the power supply 1 is fed to the load circuit 5. The latter is provided with a D.C. generating circuit 15 which supplies a D.C. voltage across terminals 7a and 7b of a control unit 7' when the power is fed to the load circuit 5.

When the manual switch 2' is turned on, the A.C. power is fed from the power supply 1 to the load circuit 5 to put the load circuit in an operating condition. At the same time, the D.C. generating circuit 15 is also put in an operating condition and the output D.C. voltage is applied across the terminals 7a and 7b. As a result, a base current of a transistor 8 flows through a resistor 9 so that the transistor 8 is turned on and a collector current thereof flows through the winding 4 turning on the make contact 3'. Once the make contact 3' is turned on, the power is fed to the load circuit through the make contact 3'. Therefore, the load circuit 5 holds its operating condition even after the turn-off of the manual switch 2', and the relay 3 holds its on-state. In order for the make contact 3' to be turned on, it is necessary that the control unit 7' has not received the stop signal from the remote control unit 6.

The termination of the operation of the load circuit 5 is carried out by an ultrasonic stop signal from the remote control unit 6 or the like. The ultrasonic stop signal from the remote control unit 6 is received by a microphone 10 which converts the received ultrasonic signal to an electric signal which, in turn, is amplified by a band amplifier 11, rectified and filtered by a diode 12 and a capacitor 13 and fed to a base of a transistor 14. The latter is then turned on resulting in the fall of a collector potential thereof and hence a base potential of the transistor 8, which is then turned off. Therefore, the relay 3 is also turned off to open the make contact 3' and the load circuit 5 and the D.C. generating circuits 15 stop their operations.

Once the D.C. generating circuit 15 stops its operation, the D.C. voltage is no longer fed to the terminals 7a and 7b so that the excitation current is no longer fed to the winding 4 and the make contact 3' is held in its off-state until the D.C. voltage is again applied across the terminals 7a and 7b, that is, until the manual switch 2' is again turned on.

Thus, even if an ultrasonic signal is fed to the microphone 10 by a certain cause, the control unit 7' does not turn on the relay 3 so long as the load circuit 5 is put in its operating condition by the manual switch 2', because no D.C. voltage is applied to the control unit 7'. While the prior art system has required a manual operation i.e. manual turn-off of the switch 2, to prevent the load circuit 5 from being erroneously operated by the malfunction of the control unit 7', the present invention can hold the stop conditions of the load circuit 5 and the control unit 7' only by the remote operation.

Furthermore, in the present invention, the winding 4 of the relay 3 is connected to the collector of the transistor 8 such that the winding 4 is excited by the collector current of the transistor 8, which is supplied from the D.C. generating circuit 15 in the load circuit 5. Accordingly, when the load circuit 5 is in its operating condition, the make contact 3' is always on until the ultrasonic stop signal is fed to the control unit 7', and when the load circuit 5 is in its non-operating condition, the make contact 3' is off. Thus, the operating condition and non-operating condition of the load circuit 5 can be held without special holding means, such as flip-flop, which has been required in the prior art system.

In the embodiment described above, the D.C. generating circuit 15 for generating a voltage to operate the control section has been explained as being provided in the remote controlled electronic equipment. This arrangement affords an advantage in that the control unit is put in the operating condition only when the remote controlled electronic equipment is in its operating condition. However, where the control unit 7' is provided with a D.C. generating circuit, the A.C. power from the power supply 1 may be fed to the D.C. generating circuit in the control unit 7' through the parallel circuit of the manual switch 2' and the make contact 3', instead of feeding the D.C. power from the load circuit 5. In this case, the electronic equipment and the control unit 7' are separately put in their operating conditions through the switch.

Figure 3:
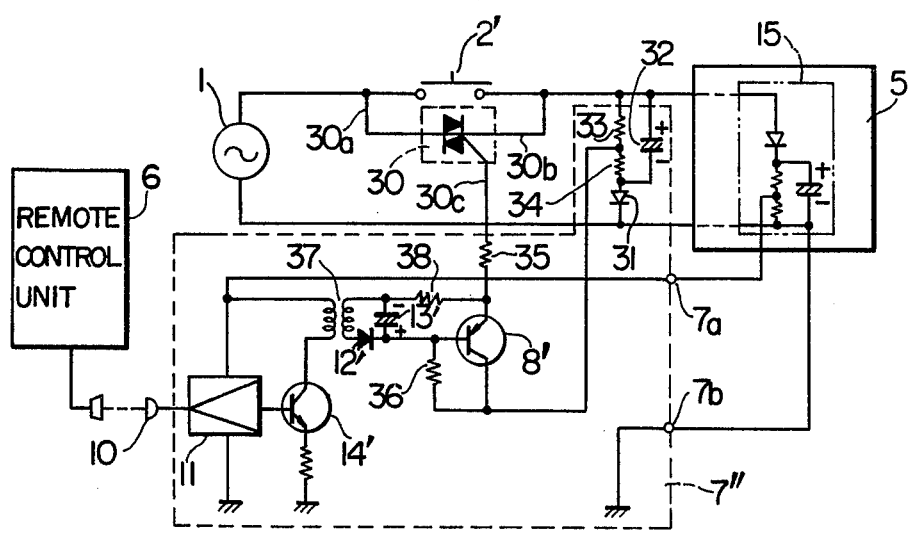
FIG. 3 is a circuit diagram showing another embodiment of the present invention.

FIG. 3 shows a circuit diagram of another embodiment of the present invention, in which a silicon controlled A.C. element (five-layer switch or FLS) is used instead of the relay 3 shown in FIG. 2.

A path between a first anode 30a and a second anode 30b of the FLS 30 corresponds to the make contact 3' of the relay 3 and a path between a control electrode 30c and the second anode corresponds to the winding 4 of the relay 3. A diode 31, a capacitor 32, resistors 33, 34 function to generate a negative D.C. potential relative to the potential at the second anode 30b, which negative D.C. potential is supplied to the control electrode 30c through a transistor 8'. When the manual switch 2' is turned on, a gate current of the FLS 30 flows through the transistor 8' by a voltage developed across the resistor 23. Thus, the FLS 30 and the transistor 8' are turned on. While a base current of the transistor 8' flows through the resistors 35 and 36, a forward bias to the base-emitter of the transistor 8' is also affected by a resistor 38.

On the other hand, when a stop signal from the remote control unit 6 is supplied to the control unit 7'', an A.C. signal is developed across a secondary winding of a transformer 37. This A.C. signal is rectified and filtered by a diode 12' and a capacitor 13' to develop a D.C. voltage, which, in turn, back-biases the base-emitter of the transistor 8', which is then switched from its on state to its off state so that the FLS 30 is also switched from its on state to off-state. Thus, the supply of power from the power supply 1 to the load circuit 5 is stopped. It should be understood that the resistance of the resistor 38 for back-biasing the transistor 8' when the stop signal is fed should be chosen such that it forward-biases the base-emitter of the transistor 8' when the stop signal is not fed.

What is claimed is:

1. A power switch for a remote controlled electronic equipment comprising;
 A. a switch element having on and off states,
 B. a control unit for controlling turn-on and turn-off of said switch element,
 C. a remote controlled load circuit,
 D. a power supply,
 E. a means for supplying a power from said power supply to said load circuit through said switch element,
 F. a means for supplying a power from said power supply to said control unit through said switch element,
 G. a remote control unit for generating a stop signal to turn off said switch element from its onstate, and
 H. a manual means for shortcircuiting said switch element when a manual operation is intervened,
 said control unit including;
  a. a holding means which is operable only when the power is being fed to said control unit to turn on said switch element and which turns off said switch element during its non-operable condition, and
  b. a stop means which is operable only when the power is being fed to said control unit to maintain said holding means in its operating condition until the stop signal is received and which switches said holding means to its non-operating condition when the stop signal is received.

2. A power switch circuit for a remote controlled electronic equipment according to claim 1 wherein;
 said switch element includes a switching section and a control section for controlling turn-on and turn-off of said switching section, the power from said power supply being fed through said switching section to said load circuit and said control unit, said control section being connected to said holding means of said control unit, and
 said manual means includes a manual switch connected in parallel with said switching section, said manual switch being turned on by a manual operation and turned off when the manual operation is released.

3. A power switch for a remote controlled electronic equipment according to claim 2 wherein;
 said control section of said switch element turns on said switching section when a current flows through said control section and turns off said switching section when no current flows therethrough, said holding means of said control unit includes a switching device having input and output terminals and a control terminal, a path between said input and output terminal of said switching device being connected in series to said control section of said switch element to form a series circuit comprising the path between said input and output terminals and said control section, whereby when said manual switch is turned on, the power from said power supply is fed to said series circuit to turn on said path between said input and output terminals so that a current flows through said series circuit to turn on said switching section, and said stop means of said control unit is operable, when it receives the stop signal from said remote control unit, to supply the received stop signal to said control terminal of said switching device to switch the path between said input and output terminals from its on-state to off-state.

4. A power switch circuit for a remote controlled electronic equipment comprising;
   A. a remote controlled electronic equipment,
   B. a remote control unit for wirelessly transmitting a signal to control turn-off of a power to said remote controlled electronic equipment,
   C. a control unit for wirelessly receiving said signal from said remote control unit during operating condition of the control unit to control the turn-off of the power of said electronic equipment,
   D. a switch means having turn-on and turn-off states controlled by said control unit,
   E. a manual means which is normally open but temporarily short-circuits said switch means when manually operated, and
   F. a means for supplying said power through said switch means to said electronic equipment and said control unit to put them in their operating conditions, said control unit including;
   a. a holding means for holding said switch means at its on-state, and
   b. a stop means for allowing said holding means to hold said switch means until the power turn-off signal from said remote control unit is received and stopping the hold function of said holding means when said power turn-off signal is received, whereby the operating conditions of said control unit and said electronic equipment, which have been attained by manually operating said manual means to short-circuit said switch means, are switched to their non-operating condition by the power turn-off control signal from said remote control signal, said non-operating conditions being non-restorable unless another manual operation is intervened.

5. A power switch for a remote controlled electronic equipment according to claim 1, wherein said remote control unit wirelessly transmits said stop signal to said control unit.

6. A power switch for a remote controlled electronic equipment according to claim 2, wherein said switch element is a relay, said switching section including a make contact of said relay and said control section including an energizing winding of said relay.

7. A power switch for a remote controlled electronic equipment according to claim 2, wherein said switch element is a multilayer semiconductor switch, said switching section including a path between a first and a second anode of said multilayer switch and said control section including a path between a control electrode and said second anode of said multilayer switch.

* * * * *